United States Patent
Shipley

(10) Patent No.: US 9,746,512 B2
(45) Date of Patent: Aug. 29, 2017

(54) ARC FAULT LOCATION DETECTION FOR AIRCRAFT WIRING

(75) Inventor: Adrian Shipley, Cheltenham (GB)

(73) Assignee: GE AVIATION SYSTEMS LIMITED, Cheltenham (GB)

( * ) Notice: Subject to any disclaimer, the term of this patent is extended or adjusted under 35 U.S.C. 154(b) by 397 days.

(21) Appl. No.: 13/062,246

(22) PCT Filed: Sep. 14, 2009

(86) PCT No.: PCT/GB2009/051186
§ 371 (c)(1),
(2), (4) Date: Mar. 4, 2011

(87) PCT Pub. No.: WO2010/032040
PCT Pub. Date: Mar. 25, 2010

(65) Prior Publication Data
US 2011/0169498 A1    Jul. 14, 2011

(30) Foreign Application Priority Data
Sep. 22, 2008   (GB) .................................. 0817297.5

(51) Int. Cl.
*G01R 31/08*   (2006.01)
*G01R 31/11*   (2006.01)
*G01R 31/00*   (2006.01)

(52) U.S. Cl.
CPC ............ *G01R 31/11* (2013.01); *G01R 31/008* (2013.01)

(58) Field of Classification Search
CPC ....................... H04B 2001/0408; H01P 1/184
USPC .................. 324/527, 500, 512, 534
See application file for complete search history.

(56) References Cited

U.S. PATENT DOCUMENTS

| | | | | |
|---|---|---|---|---|
| 4,016,516 | A | * | 4/1977 | Sauter et al. ............... 333/81 R |
| 4,142,178 | A | * | 2/1979 | Whyte et al. ................. 307/149 |
| 4,144,487 | A | * | 3/1979 | Pharney ................. G01R 31/10 324/522 |

(Continued)

FOREIGN PATENT DOCUMENTS

| | | |
|---|---|---|
| CA | 2303964 A1 | 10/2000 |
| CA | 2560791 A1 | 6/2007 |

(Continued)

OTHER PUBLICATIONS

IPCOM000047793D, Cole, AS, Molded Ferrite Inductors and Transformers, Feb. 8, 2005, pp. 1-2.*

(Continued)

*Primary Examiner* — Giovanni Astacio-Oquendo
(74) *Attorney, Agent, or Firm* — GE Global Patent Operation; William S. Munnerlyn

(57) ABSTRACT

A system for detecting the location of arc faults in an aircraft electrical wiring arrangement is provided. The system comprises a controller, operable to generate a test signal and a directional coupler for coupling the test signal into electrical wiring and for coupling reflected test signals from the electrical wiring to the controller. The electrical wiring comprises one or more wire under test and the controller is further operable to detect test signals reflected from arc faults in the wire under test and to analyze reflected test signals in order to determine one or more arc fault position therefrom. The wire under test may be live and testing can be performed without the need to use invasive in-line components.

10 Claims, 6 Drawing Sheets

(56) References Cited

U.S. PATENT DOCUMENTS

| | | | |
|---|---|---|---|
| 4,325,022 A * | 4/1982 | Pelletier | 324/533 |
| 4,350,883 A * | 9/1982 | Lagarde | 235/435 |
| 4,502,028 A * | 2/1985 | Leake | H01P 5/04 |
| | | | 324/601 |
| 5,162,664 A * | 11/1992 | Haun | H02H 1/06 |
| | | | 307/64 |
| 5,537,087 A * | 7/1996 | Naito | 336/92 |
| 6,128,169 A * | 10/2000 | Neiger | G01R 31/12 |
| | | | 324/520 |
| 6,252,354 B1 * | 6/2001 | Collins et al. | 315/111.51 |
| 6,297,730 B1 * | 10/2001 | Dickinson | H01R 13/6625 |
| | | | 307/3 |
| 6,359,597 B2 * | 3/2002 | Haj-Yousef | 343/850 |
| 6,868,357 B2 * | 3/2005 | Furse | 702/108 |
| 6,907,363 B1 * | 6/2005 | Wyant | G01R 27/18 |
| | | | 702/122 |
| 7,245,201 B1 * | 7/2007 | Kline et al. | 340/12.32 |
| 8,049,575 B2 * | 11/2011 | Fluhrer | 333/116 |
| 2002/0097056 A1 | 7/2002 | Blades et al. | |
| 2002/0167282 A1 * | 11/2002 | Kirkpatrick et al. | 315/248 |
| 2002/0175797 A1 * | 11/2002 | Black | 336/182 |
| 2003/0201780 A1 | 10/2003 | Blades et al. | |
| 2003/0232599 A1 * | 12/2003 | Dostert | H04B 3/56 |
| | | | 455/66.1 |
| 2004/0178801 A1 | 9/2004 | Hart et al. | |
| 2004/0192443 A1 * | 9/2004 | Stelzer | A63F 13/12 |
| | | | 463/42 |
| 2006/0049831 A1 | 3/2006 | Anwar | |
| 2007/0085550 A1 * | 4/2007 | Wu et al. | 324/533 |
| 2007/0088516 A1 * | 4/2007 | Wolf et al. | 702/81 |
| 2007/0194796 A1 | 8/2007 | Harrison et al. | |
| 2008/0062592 A1 | 3/2008 | Bax et al. | |
| 2008/0094766 A1 * | 4/2008 | Casey | H02H 9/041 |
| | | | 361/56 |
| 2009/0284332 A1 * | 11/2009 | Moore et al. | 333/24 |
| 2012/0133150 A1 * | 5/2012 | Dooley | F01D 15/10 |
| | | | 290/1 A |
| 2012/0273309 A1 * | 11/2012 | Thibault | B60T 8/00 |
| | | | 188/158 |

FOREIGN PATENT DOCUMENTS

| | | |
|---|---|---|
| EP | 0971238 A2 * | 1/2000 |
| EP | 0971238 A2 | 1/2000 |
| EP | 1443622 A2 | 8/2004 |
| EP | 1593981 A2 | 11/2005 |
| GB | 241752 A | 10/1925 |
| GB | 2419752 A | 5/2006 |
| WO | 2004005943 A2 | 1/2004 |
| WO | 2004072814 A2 | 8/2004 |
| WO | 2005086812 A2 | 9/2005 |

OTHER PUBLICATIONS

IPCOM000009598D, Method for the use of carbon materials for signal coupling across plane splits on PCBs, Sep. 4, 2002, pp. 1-4.*
Search Report under Section 17 for Great Britain Application No. GB0817297.5 filed on Sep. 22, 2008.
International Search Report for International Patent Application No. PCT/GB2009/051186 filed on Sep. 14, 2009.
Furse, C., et al.: "Noise-Domain Reflectometry for Locating Wiring Faults," vol. 47, No. 1, Feb. 1, 2005, pp. 97-104.
http://www.livewiretest.com.
Cynthia Furse, Paul Smith, Chet Lo, Yu Chung Chung, Praveen Pendayala and Kedarnath Nagoti, "Spread spectrum sensors for critical fault location on live wire networks," Structural Control and Health Monitoring, vol. 12, pp. 257-267, Jun. 6, 2005, Wiley InterScience.
Cynthia Furse, Paul Smith, Mehdi Safavi and Chet Lo, "Feasibility of Spread Spectrum Sensors for Location of Arcs on Live Wires," IEEE Sensors Journal, vol. 5, No. 6, pp. 1445-1450, Dec. 2005.
Paul Smith, Cynthia Furse and Jacob Gunther, "Analysis of Spread Spectrum Time Domain Reflectometry for Wire Fault Location," IEEE Sensors Journal, vol. 5, No. 6, pp. 1469-1478, Dec. 2005.
Chirag R. Sharma, Cynthia Furse and Reid R. Harrison, "Low-Power STDR CMOS Sensor for Locating Faults in Aging Aircraft Wiring," IEEE Sensors Journal, vol. 7, No. 1, pp. 43-50, Jan. 2007.

* cited by examiner

ARC FAULT LOCATION DETECTION FOR AIRCRAFT WIRING

FIELD OF INVENTION

The present invention relates generally to electrical wiring safety. More particularly, the present invention relates to arc fault location detection for aircraft wiring which may, for example, be used during aircraft maintenance to determine the position of wiring faults such as those that are likely to cause electrical arcing.

BACKGROUND OF THE INVENTION

Aircraft are highly complex machines that operate under a variety of extreme conditions of temperature, precipitation, pressure, vibration, etc. One important component of any aircraft is its electronic control and power distribution systems, which are often provided by using many kilometers of wiring provided behind various sealed wall and fuselage panels.

Wiring in aircraft can be critical to proper operation and regular checks and maintenance are essential to ensure that wires subject to aging, accidental damage caused during maintenance, vibration or rubbing against other wires during flight, getting bent, getting wet, stamped on, etc., are serviceable and not dangerous.

To aid in checking the condition of such aircraft wiring various fault detection and location devices, such as circuit breakers, etc., are known for use in aircraft [1-3]. However, these conventional devices do not necessarily detect or prevent certain difficult to detect wiring faults, such as arcing, which may only occur intermittently and in an unpredictable manner.

Arcing may be particularly dangerous, for example, where it creates sparks that then cause ignition of combustible materials. Indeed arcing has been associated with various air accidents: e.g. in July 1996 when TWA 800 exploded mid-air near New York killing all persons on board and in September 1998 when Swissair 111 endured a cockpit fire and subsequently crashed into the sea also killing all on board. In both cases, faulty wiring that caused subsequent arcing is believed to be at the root of the accident.

Given the potential dangers associated with arcing, various arc detection systems have therefore been developed [4-8]. However, whilst such arc detection systems are an improvement upon previous fault detection and location devices [1-3], there remains the problem of accurately locating the position of faults that cause arcing, especially for intermittent arcs where there is no easy access to a wire or wire bundle that needs to be tested (e.g. where such wires are embedded behind aircraft panels and are out of reach).

The present invention has thus been devised whilst bearing the above-mentioned drawbacks associated with conventional techniques in mind.

SUMMARY OF THE INVENTION

According to a first aspect of the present invention, there is provided a system for detecting the location of arc faults in an aircraft electrical wiring arrangement. The system comprises a controller operable to generate a test signal and a directional coupler for coupling the test signal into electrical wiring comprising one or more wires under test. The directional coupler is also for coupling reflected test signals from the electrical wiring to the controller. The controller is also operable to detect test signals reflected from arc faults in the wire under test and to analyse reflected test signals in order to determine one or more arc fault position therefrom.

According to a second aspect of the present invention, there is provided a non-intrusive directional coupler for coupling a test signal into electrical wiring of an aircraft, comprising one or more wires under test, and for coupling reflected test signals from the electrical wiring to a controller.

According to a third aspect of the present invention, there is provided a method of detecting the location of arc faults in an aircraft electrical wiring arrangement. The method comprises directing a test signal in a predetermined direction along a wire under test, detecting reflected test signals from the wire under test, and determining one or more arc fault positions from the detected reflected test signals.

In various aspects and embodiments of the present invention, the wire or wires under test can be live. This means that an aircraft's electrical systems may be operated under various operating conditions and simultaneously be tested in order that intermittent or transient faults, e.g. arcing, might appear which might not otherwise be apparent when various systems, such as the engines, are shut down.

Advantageously, use of a directional coupler also allows a test signal to be injected at various points on the electrical wiring. For example, a test signal may be coupled into a wire bundle at point where that bundle is most easily accessible within an aircraft.

Additionally, use of a non-invasive directional coupler also removes the need to provide wiring with a hard-wired, invasive, arc location detection system. By removing the need to provide various invasive inline components to add arc location detection functionality, various embodiments of the present invention can thus be used with existing aircraft wiring without a need to retrofit invasive components that might, for example, require the modified wiring to be tested and recertified to ensure it meets various aviation authority compliance standards, such as those set by the Civil Aviation Authority (CAA) in the UK, the Federal Aviation Authority (FAA) in the USA, etc.

BRIEF DESCRIPTION OF THE DRAWINGS

Various aspects and embodiments of the present invention will now be described in connection with the accompanying drawings, in which.

DETAILED DESCRIPTION OF THE INVENTION

Figure 1:
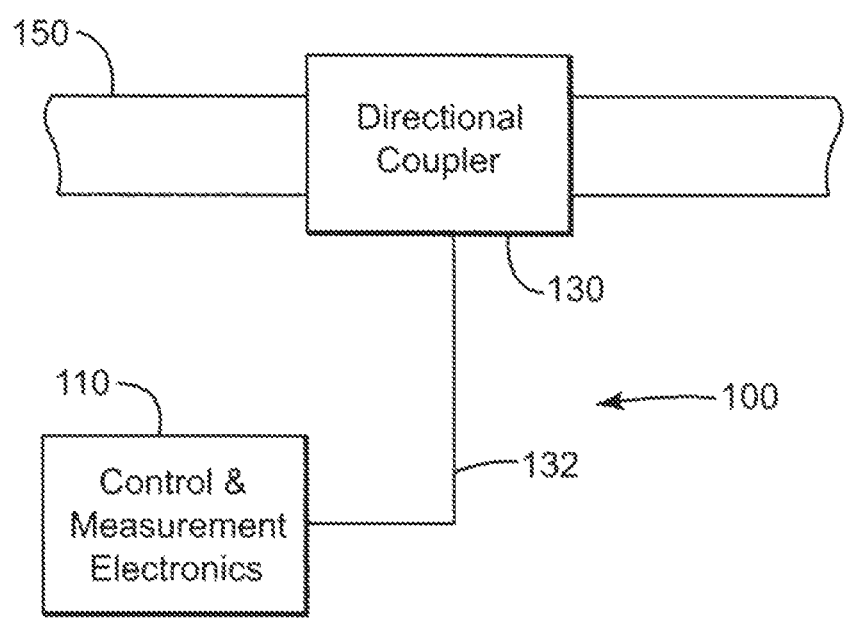
FIG. 1 shows a system for detecting the location of arc faults in an aircraft electrical wiring arrangement according to various embodiments of the present invention.

FIG. 1 shows a system 100 for detecting the location of arc faults in an aircraft electrical wiring arrangement. The electrical wiring arrangement comprises electrical wiring 150 composed of one or more wires under test.

The system 100 includes a controller 110 that is operable to generate a test signal. The test signal may, for example, be an alternating current (AC) signal having a frequency that is removed from an operating signal band of the wiring 150, such that the test signal does not interfere with the operating signals that are used when the wiring 150 is operated normally. This enables the wiring 150 to be tested live with both operating signals and test signals propagating in the wiring 150.

The controller 110 can, for example, use various radio frequency (RF) test signals encoded using various modulation schemes. Test signals that are reflected from wiring faults can then be detected and, using time-of-flight measurements, for example, the positions of those faults relative to the injection point of the test signal into the wiring 150 can be determined. For example, in various embodiments bipolar phase shift keying (BPSK) is used as a modulation scheme in a spread spectrum time domain reflectometer (SSTDR) operating at RF from about 1.5 MHz to about 144 MHz, whereas a typical aircraft power distribution system would operate at a frequency of 400 Hz.

In various embodiments of the controller 110, various commercially available products can be used to provide controller functionality. For example, a LiveWire™ Mobile Service Pack (MSP) or a LiveWire™ Integrated Circuit (IC) available, or soon to be available, from LiveWire™ Test Labs, Inc. of Salt Lake City, Utah, U.S.A. may be used [9], however without invasively coupling an MSP or IC in the conventional manner (see also references [10-14] for further details relating to possible controller embodiments).

The controller 110 is operable to generate the test signals and to couple the test signals into a directional coupler 130 through an electrical connection 132.

The directional coupler 130 couples the test signal into the electrical wiring 150 enabling it to propagate in a first direction along the wiring 150 whilst at least partially blocking the test signal from propagating along a second opposite direction along the wiring 150. The directional coupler 130 also couples reflected test signals, generated from the test signal propagating along the first direction, back along a reciprocal path through the electrical connection 132 to the controller 110.

The controller 110 is then operable to receive test signals reflected from arc faults in the wire under test and to analyse the reflected test signals in order to determine one or more arc fault position therefrom.

Analysis can be performed, for example, by periodically refilling a ring buffer in controller 110 with reflected signal data at a known buffer frame frequency (u), counting the number (N) of completed ring buffer acquisitions that have occurred and auto-correlating the reflected signal data with data representing the modulated test signal in order to look for correlation "spikes". Upon detecting such spikes, the ring buffer data acquisition can be halted, or captured and read out, and the position ($m^{th}$ out of a buffer of width M) of the correlation spike within the $N^{th}$ ring buffer data frame indicates the time of flight ($t_f$) of the arc fault along the wiring, thus:

$$t_f = \frac{1}{v}\left(N + \frac{m}{M}\right) \quad \text{Equation (1)}$$

The time of flight value $t_f$ can then be converted to a physical distance, thus enabling a pinpointing of the position of the fault along the wiring 150 relative to the directional coupler 130.

Figure 2:
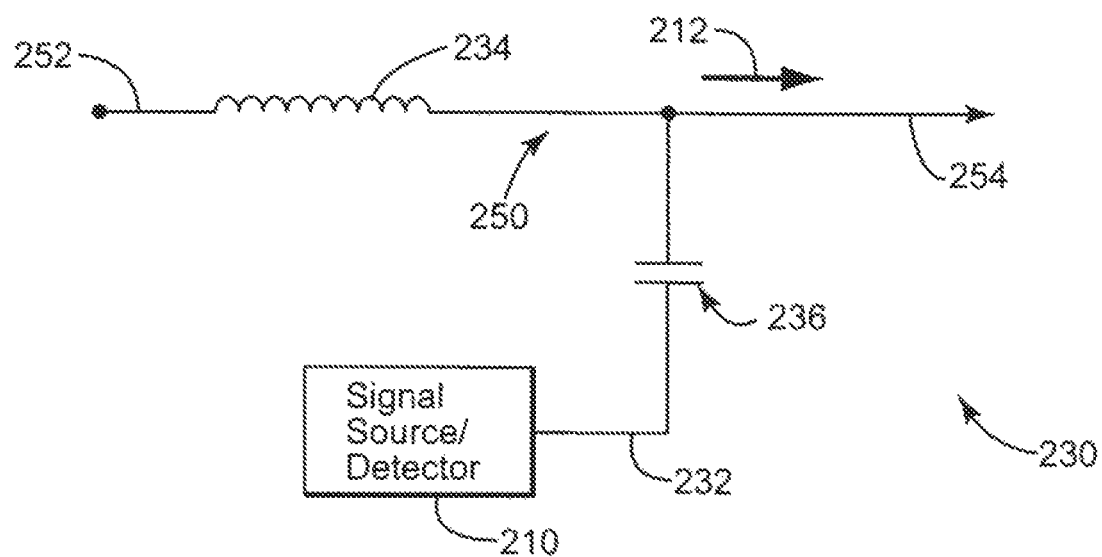
FIG. 2 shows an electrical equivalent circuit diagram for a directional coupler provided by various embodiments of the present invention.

FIG. 2 shows a schematic electrical equivalent circuit diagram for a directional coupler 230 used for various embodiments of the present invention. The directional coupler 230 provides a series blocking inductor 234 and a parallel coupling capacitor 236 with a wire under test 250. The inductance of the blocking inductor 234 may be induced in the wire under test 250 itself in a non-invasive manner rather than by being provided as a wired-in or inline inductor component, for example.

A signal source and detector unit 210 is also shown connected to the directional coupler 230 by an electrical connection 232. The signal source and detector unit 210 might be provided as part of a controller, for example, controller 110.

Test signals generated by the signal source and detector unit 210 are transmitted via the electrical connection 232 through the parallel coupling capacitor 236 and into the wire under test 250. The test signal propagates in a first direction shown by arrow 212, into a first portion 254 of the wire under test 250, in a direction away from the blocking inductor 234. The test signal is at least partially blocked from propagating along a second opposite direction into a second portion 252 of the wire under test 250 by the blocking inductor 234.

Reflected test signals from the first portion 254 travel back towards the directional coupler 230 in a direction opposed to arrow 212. The reflected test signals are then at least partially blocked from propagating into the second portion 252 of the wire under test 250 by the relatively high impedance provided by the blocking inductor 234. The reflected test signals thus couple back to the signal source and detector unit 210 through the lower impedance path provided by the parallel coupling capacitor 236 and the electrical connection 232.

Appropriate selection of the parallel coupling capacitor 236 capacitance and the blocking inductor 234 inductance allows the direction coupler to be effective for test signals whilst not substantially affecting the normal operation of the wire under test 250 (e.g. by blocking the normal operating signals). For example, inductance and capacitance values might be selected to provide an LC filter characteristic that substantially blocks test signal in the range 1.5 MHz-144 MHz whilst substantially passing operating signals at 400 Hz.

Figure 3:
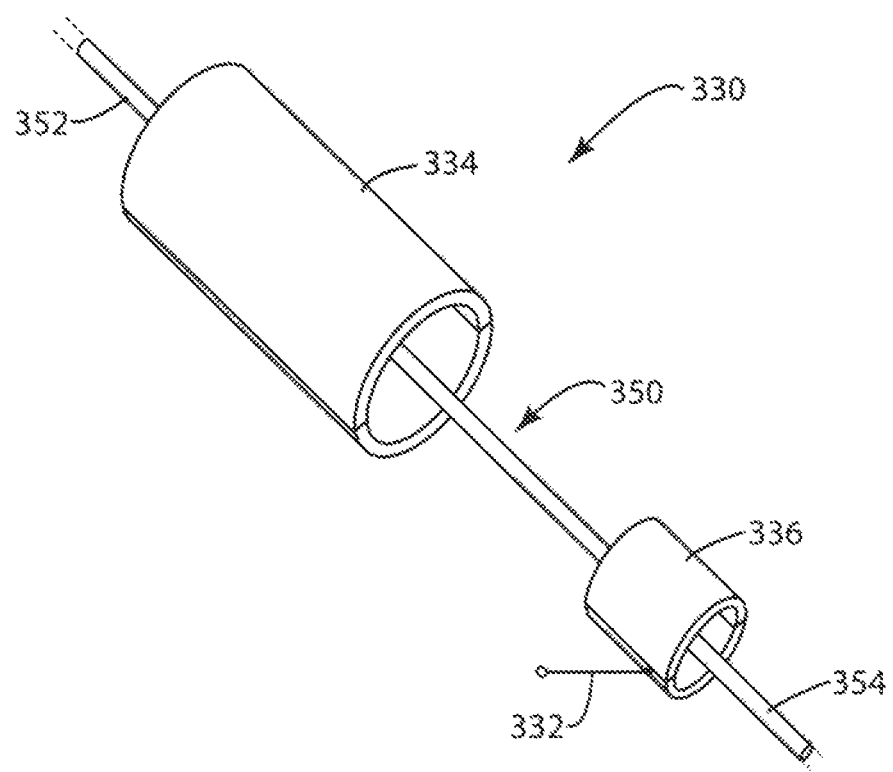
FIG. 3 shows a non-intrusive directional coupler in accordance with an embodiment of the present invention.

FIG. 3 shows a non-intrusive directional coupler 330 in accordance with an embodiment of the present invention. The directional coupler 330 is a non-invasive/non-intrusive directional coupler and does not need to be directly physically connected (e.g. wired, hardwired, etc.) to the wiring under test 350.

A series blocking inductor is formed by providing a magnetic material 334 around a first portion 352 of the wire under test 350. The magnetic material 334 is provided in two or more parts that together form a split cylinder arrangement, which may or may not be circular in cross section. By providing a split cylinder arrangement, the magnetic material can be releasably provided around the wire under test 350. When in situ about a wire under test 350, the cylindrical arrangement of magnetic material 334 induces an inductance into the wire under test 350 that acts as the blocking inductor. In various embodiments of the present invention the magnetic material 334 comprises ferrite that may, for example, be provided in a releasable hand-held clamp arrangement (not shown).

A parallel coupling capacitor is formed by providing a conductive layer 336 around a second portion 354 of the wire under test 350. The conductive layer 336 is also provided in two or more parts that together form a split cylinder arrangement, which may or may not be circular in cross section. When in situ about a wire under test 350, the cylindrical arrangement of the conductive layer 336 provides capacitive coupling from an electrical connector 332 to the wire under test 350, thereby acting as the parallel coupling capacitor.

The conductive layer 336 may be made from a metallic material optionally provided with one or more insulating/dielectric layers disposed between it and the wire under test 350. For example, the conductive layer 336 may be provided as an overlying metallisation/metallic layer provided on a ceramic material. The conductive layer 336, and any optional associated elements, may also be provided in a releasable hand-held clamping arrangement (not shown).

In various embodiments of the present invention, the magnetic material 334 and/or the conductive layer 336 and any optional associated components may provided as a plurality of sub-elements that can be disposed about the wire under test 350 in order to scale the induced inductance and/or capacitance up or down for a particular application. For example, a directional coupler may be provided as a hand-held unit with a configurable range of capacitance and/or inductance values that can be modified by adding or removing various components. Such devices can be useful to enable the capacitance and/or inductance values to be tailored for optimised performance when used with wiring of a particular aircraft type.

Figure 4:
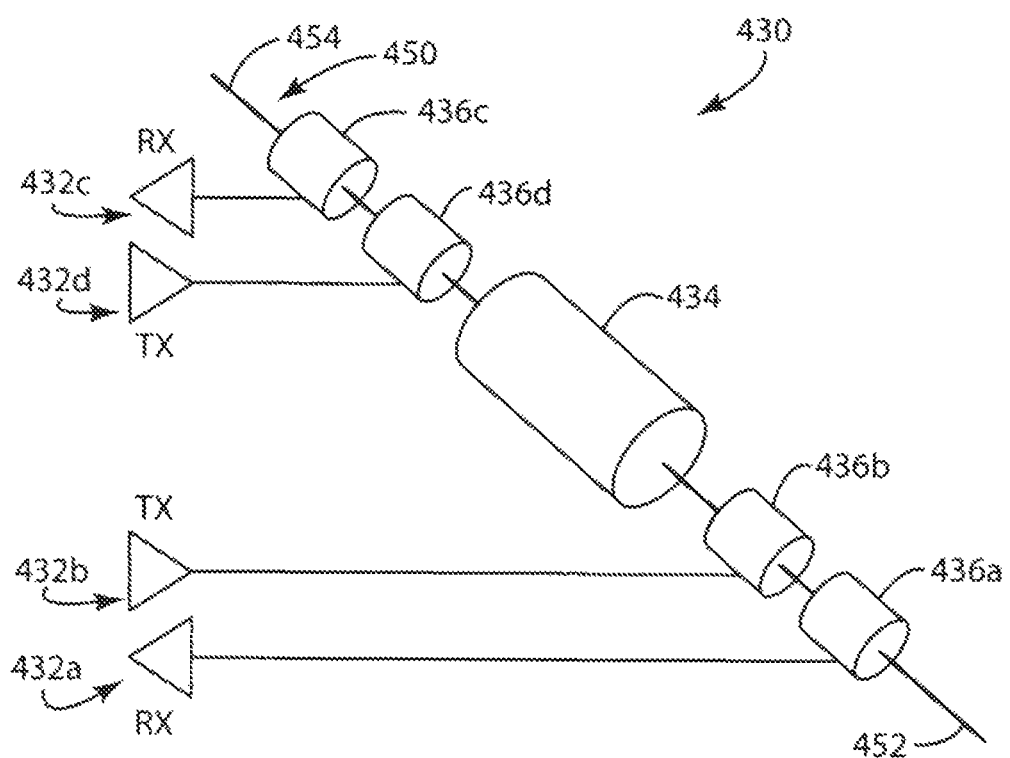
FIG. 4 shows a further non-intrusive directional coupler in accordance with an embodiment of the present invention.

FIG. 4 shows a non-intrusive directional coupler 430 in accordance with a further embodiment of the present invention. The directional coupler 430 is a bi-directional coupler for coupling the test signal into one or more of a first direction along one or more wire under test 450 and a second direction along the one or more wire under test 450, the first and second directions being oppositely directed.

A series blocking inductor is formed by providing a magnetic material 434 around a portion of the wire under test 450. The magnetic material 434 is provided in two or more parts that together form a split cylinder arrangement, which may or may not be circular in cross section. By providing a split cylinder arrangement, the magnetic material can be releasably provided around the wire under test 450. When in situ about a wire under test 450, the cylindrical arrangement of magnetic material 434 induces an inductance into the wire under test 450 that acts as the blocking inductor. In various embodiments of the present invention the magnetic material 434 comprises ferrite that may, for example, be provided in a releasable hand-held clamp arrangement (not shown).

A set of four parallel coupling capacitors 436 is provided. A first pair of coupling capacitors are provided by metal-coated cylindrical elements 436a and 436b at a first end 452 of the wire under test 450. A second pair of coupling capacitors are provided by metal-coated cylindrical elements 436c and 436d at a second end 454 of the wire under test 450. The first pair of coupling capacitors is separated from the second pair of coupling capacitors along the direction of the wire under test 450 by the magnetic material 434.

In various variations of this embodiment, one or more of the magnetic material 434 and the cylindrical elements 436a, 436b, 436c, 436d may be formed of one or more sub-elements. These might also be included in a hand-held clamping arrangement for removeably positioning them about one or more wires under test.

Test signals can be injected into the wire under test 450 and/or reflected test signal received from the wire under test 450 using any of the four cylindrical elements 436a, 436b, 436c, 436d. In the illustrated embodiment, however, first cylindrical element 436a is configured as a receiver channel, second cylindrical element 436b is configured as a transmitter channel, third cylindrical element 436c is configured as a receiver channel and fourth cylindrical element 436d is configured as transmitter channel.

In various preferred embodiments, separate receiver and transmitter channel capacitors are provided as, ideally, the source impedance for any transmitter is low (preferably zero) and the input impedance for any receiver is high (preferably infinite). Thus if only a single channel capacitor were to be used for both the transmitter and receiver channels, signal obtained from reflected test signal injection may be attenuated due to the low impedance of the transmitter.

In operation, test signal is injected into the wire under test 450 through the transmitter channel of second cylindrical element 436b. The test signal then propagates along the wire under test in the direction of the first end 452, whilst being inhibited from propagating in the opposite direction by the inductance induced in the wire under test 450 by the magnetic material 434. Any reflected test signal generated in the first end 452 is reflected back along the receiver channel created using the first cylindrical element 436a to a detector (not shown).

Simultaneously, test signal can also be injected into the wire under test 450 through the transmitter channel of fourth cylindrical element 436d. The test signal then propagates along the wire under test in the direction of the second end 454, whilst being inhibited from propagating in the opposite direction by the inductance induced in the wire under test 450 by the magnetic material 434. Any reflected test signal generated in the first end 454 is reflected back along the receiver channel created using the third cylindrical element 436c to a detector (not shown).

Although test signal can be injected into the first end 452 and second end 454 of the wire under test simultaneously, it is to be understood that this need not be the case. However, where this is the case only a single test signal generator need be used to supply both transmitter channels. Simultaneous test signal generation is also advantageous as it speeds the overall test process by analysing both ends 452, 454 of the wire under test at around the same time.

Whilst the illustrated receiver channels are separated, they may be sampled using only a single controller to determine the positions of any electrical faults therein. For example, data acquisition could be performed by multiplexing the two receiver channels into a single controller unit.

One advantage of the bi-directional directional coupler 430 is an ability to test the whole length of the wire under test 450, regardless of where on the wire under test 450 the directional coupler 430 is positioned.

Another advantage of bi-directional directional coupler 430 lies in the fact that it can be operated in a differential mode to obtain reflected test signals having a high common mode rejection ratio (CMRR). For example, if the inductance induced by the magnetic material 434 does not provide good blocking of reflected signals, some reflected signal will pass though the inductance to an end of the wire where it is not desired. However by subtracting the reflected signals obtained from the receiver channels from one another, the controller can be made to compensate for the less-than-perfect electrical characteristics of the induced inductor. This enables an enhanced signal-to-noise ratio (SNR) to be obtained making a system incorporating such technology better able to detect and locate wiring faults.

For example, in various embodiments of the present invention, various electrical and physical characteristics of a transducer will be known. It is thus known how much delay to impose and how much signal to be subtracted from the opposite side of a blocking inductance. In other words, a transmitted signal for an intended direction will go out, however, some of that signal will pass through the inductance. If an attenuated version of the transmitted signal is then subtracted from the other side of the inductance after a certain determinable period of time, the leaked signal can thus be substantially removed.

Figure 5:
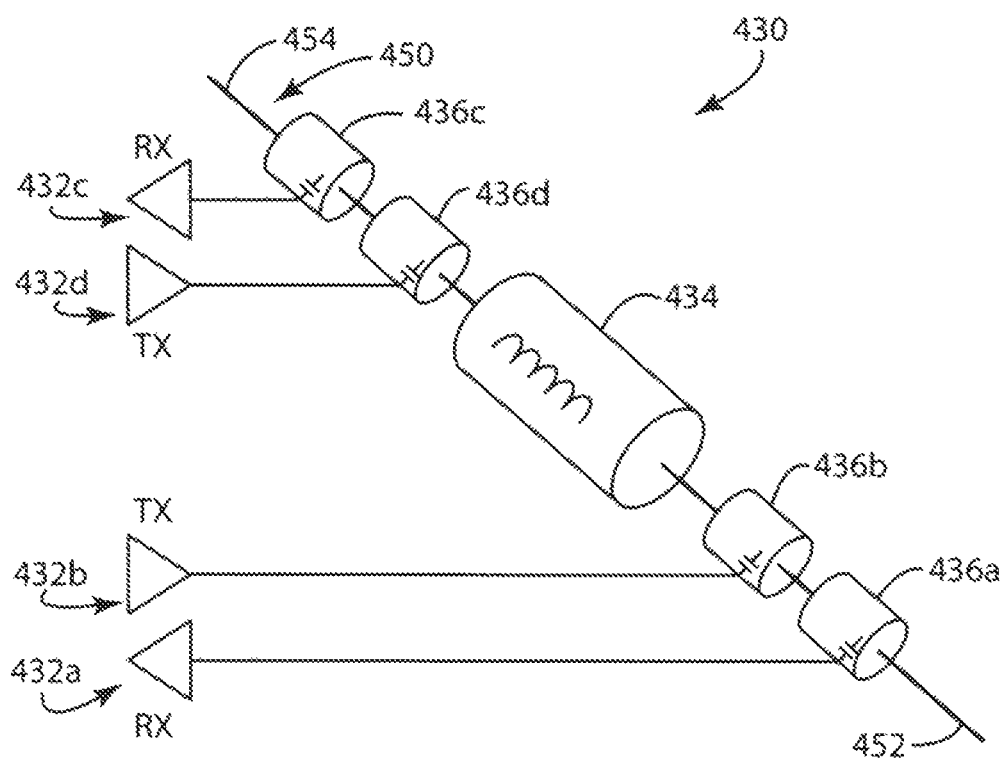
FIG. 5 shows schematically an electrical equivalent circuit diagram for the directional coupler of FIG. 4.

FIG. 5 shows schematically an electrical equivalent circuit diagram for the directional coupler 430 of FIG. 4.

The magnetic material 434 induces a series inductance in the wire under test 450. The first cylindrical element 436a provides a parallel coupling capacitance between the first end 452 of the wire under test 450 and a first receiver channel 432a. The second cylindrical element 436b provides a parallel coupling capacitance between the first end 452 of the wire under test 450 and a first transmitter channel 432b. The third cylindrical element 436c provides a parallel coupling capacitance between the second end 454 of the wire under test 450 and a second receiver channel 432c. The fourth cylindrical element 436d provides a parallel coupling capacitance between the second end 454 of the wire under test 450 and a second transmitter channel 432d.

Figure 6:
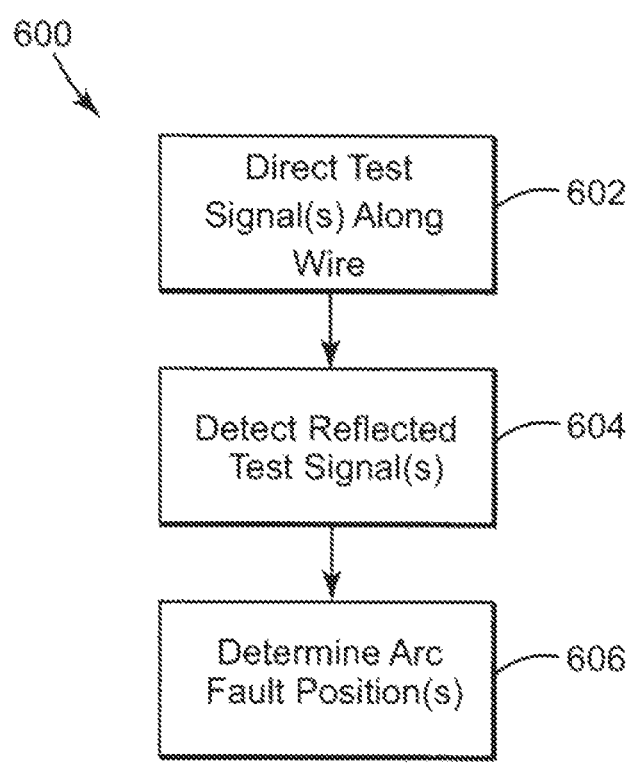
FIG. 6 illustrates a method of detecting the location of arc faults in an aircraft electrical wiring arrangement according to various embodiments of the present invention.

FIG. 6 illustrates a method 600 of detecting the location of arc faults in an aircraft electrical wiring arrangement according to various embodiments of the present invention. The method 600 comprises the initial step of directing 602 one or more test signals in a predetermined direction along a wire under test. For example, two counter propagating test signals may be injected using a bi-direction non-intrusive directional coupler. Having injected test signal, at step 604 any reflected test signals are then detected. Finally in method 600, one or more arc fault positions are determined at step 606 from the detected reflected test signals.

In various embodiments of the present invention the reflected test signals are RF signals modulated or encoded using a predetermined scheme, such as, for example, spectral time domain reflectometry (STDR) using a pseudo-noise (PN) code or SSTDR using a sine wave modulated PN code [10-14]. Such techniques permit location of intermittent faults when the faults temporarily induce near open circuits or near short circuits in the wire under test.

Whilst the present invention has been described in terms of various embodiments, those skilled in the art will be aware that many different embodiments are possible. Moreover, it is the Applicant's intention that all such variants and embodiments constitute part of the present invention.

For example, in various embodiments of the present invention a directional coupler may be provided that is releasably clampable about a wire, a wire bundle and/or at least one wire of an aircraft electrical wiring arrangement.

Various aspects and embodiments of the present invention may be used for corrective maintenance of aircraft wiring. In this case, a wire having an arc fault will already have tripped a circuit breaker and the maintenance team will know which individual wire the arc fault occurred on. For maintenance, a directional coupler may thus be hooked around a wire bundle containing the known faulty wire, the appropriate circuit breaker for the faulty wire reset, and continued operation be performed whilst monitoring the wire to determine the position or locations of one or more arc faults therein.

In certain embodiments, a directional coupler may be provided in a probe device, which probe device may be placed at various positions about an aircraft wiring harness. Test signals can then, for example, be coupled to a wire bundle at a point where the wire bundle is most easily accessible. Numerous designs for such probe devices, handheld or otherwise, will be readily apparent to those skilled in the art.

REFERENCES

1. WO 2005/086812 A2
2. GB 2 419 752 A
3. US 2008/0062592 A1
4. CA 2 303 964 A1
5. US 2002/0097056 A1
6. WO 2004/072814 A2
7. US 2003/0201780 A1
8. CA 2 560 791 A1
9. http://www.livewiretest.com
10. Chet Lo and Cynthia Furse, "Noise-Domain Reflectometry for Locating Wiring Faults," IEEE Transactions on Electromagnetic Compatibility, vol. 47, no. 1, pp. 97-104, February 2005
11. Cynthia Furse, Paul Smith, Chet Lo, You Chung Chung, Praveen Pendayala and Kedarnath Nagoti, "Spread spectrum sensors for critical fault location on live wire networks," Structural Control and Health Monitoring, vol. 12, pp. 257-267, 6 Jun. 2005, Wiley InterScience
12. Cynthia Furse, Paul Smith, Mehdi Safavi and Chet Lo, "Feasibility of Spread Spectrum Sensors for Location of Arcs on Live Wires," IEEE Sensors Journal, vol. 5, no. 6, pp. 1445-1450, December 2005
13. Paul Smith, Cynthia Furse and Jacob Gunther, "Analysis of Spread Spectrum Time Domain Reflectometry for Wire Fault Location," IEEE Sensors Journal, vol. 5, no. 6, pp. 1469-1478, December 2005
14. Chirag R. Sharma, Cynthia Furse and Reid R. Harrison, "Low-Power STDR CMOS Sensor for Locating Faults in Aging Aircraft Wiring," IEEE Sensors Journal, vol. 7, no. 1, pp. 43-50, January 2007

Where permitted, the contents of the above-mentioned references are hereby also incorporated into this application by reference in their entirety.

What is claimed is:

1. A system for detecting the location of arc faults in an aircraft electrical wiring arrangement, the system comprising:
   a controller that generates a test signal; and
   a non-invasive or non-intrusive directional coupler comprising a parallel coupling capacitor for coupling the test signal into aircraft electrical wiring and for coupling reflected test signals from the aircraft electrical wiring to the controller, the aircraft electrical wiring comprising one or more wire under test, the directional coupler further comprising a series blocking inductor being formed by a magnetic material provided in two or more parts that together form a first split cylinder connectable around a first portion of the one or more wire under test, and the parallel coupling capacitor being formed by a conductive layer provided in two or more parts that together form a second split cylinder connectable around a second portion of the one or more wire under test, each of the parallel coupling capacitor and the series blocking inductor being coupled to the wire under test without a physical connection thereto; wherein the controller detects test signals reflected from arc faults in the wire under test and to analyse reflected test signals in order to determine one or more arc fault positions therefrom.

2. The system of claim 1, wherein the directional coupler is a bi-directional coupler that couples the test signal into one or more of a first direction along the one or more wire under test and a second direction along the one or more wire under test, the first and second directions being oppositely directed.

3. The system of claim 2, wherein the bi-directional coupler comprises an inductive element and a plurality of capacitive elements.

4. The system of claim 1, wherein the directional coupler is releasably clampable about at least one wire under test.

5. The system for detecting the location of arc faults in an aircraft electrical wiring arrangement according to claim 1 wherein the parallel coupling capacitor comprises first and second parallel coupling capacitors, the first parallel coupling capacitor being configured as a transmission channel for injecting the test signal into the wire under test, the second parallel coupling capacitor being configured as a receiver channel for receiving the reflected test signal from the wire under test.

6. A non-invasive or non-intrusive directional coupler configured to couple a test signal into electrical wiring of an aircraft for detecting a location of an arc fault and configured to couple reflected test signals from the electrical wiring to a controller, the electrical wiring comprising one or more wire under test, wherein the directional coupler electrically comprises a series blocking inductor and a parallel coupling capacitor with the one or more wire under test, and wherein the series blocking inductor comprises a magnetic material and is provided in two or more parts that together form a first split cylinder around a first portion of the one or more wire under test and the parallel coupling capacitor comprises a conductive layer is provided in two or more parts that together form a second split cylinder around a second portion of the one or more wire under test, and each of the parallel coupling capacitor and the series blocking inductor being coupled to the one or more wire under test without a physical connection thereto.

7. The non-intrusive directional coupler of claim 6, wherein the directional coupler is a bi-directional coupler configured to couple a test signal into one or more of a first direction along one or more wire under test and a second direction along one or more wire under test, the first and second directions being oppositely directed.

8. The non-intrusive directional coupler of claim 7, wherein the bidirectional coupler comprises an inductive element and a plurality of capacitive elements.

9. The non-intrusive directional coupler of claim 6, wherein the directional coupler is releasably clampable about one or more wire under test.

10. The directional coupler according to claim 6 wherein the parallel coupling capacitor comprises first and second parallel coupling capacitors, the first parallel coupling capacitor being configured as a transmission channel for injecting the test signal into the wire under test, the second parallel coupling capacitor being configured as a receiver channel for receiving the reflected test signal from the wire under test.

* * * * *